United States Patent
Frulio et al.

(10) Patent No.: US 7,430,150 B2
(45) Date of Patent: Sep. 30, 2008

(54) METHOD AND SYSTEM FOR PROVIDING SENSING CIRCUITRY IN A MULTI-BANK MEMORY DEVICE

(75) Inventors: Massimiliano Frulio, Milan (IT); Stefano Sivero, Vergiate (IT); Fabio Tassan Caser, Arcore Milano (IT); Mauro Chinosi, Burago Di Molgora (IT)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/123,544

(22) Filed: May 5, 2005

(65) Prior Publication Data
US 2006/0083097 A1    Apr. 20, 2006

(30) Foreign Application Priority Data
Oct. 20, 2004    (IT) .......................... MI2004A1988

(51) Int. Cl.
*G11C 11/34* (2006.01)
*G11C 16/06* (2006.01)
*G11C 7/00* (2006.01)
*G11C 7/02* (2006.01)
*G11C 7/06* (2006.01)

(52) U.S. Cl. ............................ 365/230.03; 365/185.21; 365/208; 365/185.13; 365/185.11; 365/53

(58) Field of Classification Search ............. 365/230.03, 365/185.11, 185.12, 185.13
See application file for complete search history.

(56) References Cited

U.S. PATENT DOCUMENTS

| | | | |
|---|---|---|---|
| 5,828,616 A | 10/1998 | Bauer et al. | |
| 6,275,407 B1 * | 8/2001 | Otsuka | ......................... 365/63 |
| 6,275,417 B1 | 8/2001 | Lee et al. | |
| 6,323,799 B1 | 11/2001 | Pasotti et al. | |
| 6,442,644 B1 * | 8/2002 | Gustavson et al. | .......... 711/105 |
| 6,697,282 B1 | 2/2004 | Keeney et al. | |
| 6,922,359 B2 * | 7/2005 | Ooishi | ................... 365/185.16 |
| 2003/0145151 A1 | 7/2003 | Matsushita et al. | |

* cited by examiner

*Primary Examiner*—Huan Hoang
*Assistant Examiner*—Michael Weinberg
(74) *Attorney, Agent, or Firm*—Sawyer Law Group LLP

(57) ABSTRACT

A method and system for providing a multi-bank memory is described. The method and system include providing a plurality of banks. Each of the plurality of banks includes at least one array including a plurality of memory cells and analog sensing circuitry. The method and system further include providing common digital sensing circuitry coupled with the plurality of banks.

15 Claims, 5 Drawing Sheets

METHOD AND SYSTEM FOR PROVIDING SENSING CIRCUITRY IN A MULTI-BANK MEMORY DEVICE

CROSS-REFERENCE TO RELATED APPLICATIONS

This application claims benefit under 35 USC 119 of Italian Application no. MI2004A 001988, filed on Oct. 20, 2004.

FIELD OF THE INVENTION

The present invention relates to memory devices and more particularly to a method and system for providing sensing circuitry in a nonvolatile memory device.

BACKGROUND OF THE INVENTION

Nonvolatile memory devices are used to store data such that removal of the power to the device does not result in the data being lost. Instead, the data continues to be stored despite the removal of power. FIG. 1 depicts one such conventional memory device 10. The conventional memory device 10 includes an array 12 having a number of cells (not explicitly shown in FIG. 1). The conventional memory device 10 also includes a conventional row decoder 14, a conventional column decoder 16, conventional sense amplification circuitry 18, conventional high voltage switches 20, a conventional data multiplexer 22, conventional programming logic 24, and a conventional input/ouput (I/O) bus 26.

The conventional row decoder 14 and conventional column decoder 16 are used to address memory cells within the array 12. The conventional column decoder 16, for example, routes data in the addressed columns of the conventional array 12 to the conventional sense amplification circuitry 18. The conventional sense amplification circuitry 18 typically includes a number of sense amplifiers (not explicitly shown) which read the data in the addressed columns. The conventional data multiplexer 22 drives the conventional I/O bus 26 to output the data. The conventional programming logic 24 receives from the conventional I/O bus 26 the data to be programmed and controls the high voltage switches 8. Thus, using the conventional memory device 10, data stored in the nonvolatile memory 10 can be read and stored.

Although the conventional memory 10 functions, one of ordinary skill in the art will readily recognize that the conventional, single bank memory 10 may be incapable of performing read-while-write operations or read-while-erase operations.

FIGS. 2 and 3 depict conventional memory devices 30 and 50 that can perform read-while-write operations or read-while-erase operations. In order to do so, each of the conventional memory devices 30 and 50 is broken into banks. For example, FIG. 2 depicts the conventional memory device 30, which has n banks 31. Each bank 31-$i$ includes an array 32-$i$ of conventional storage cells (not explicitly shown). The conventional memory 30 includes an x decoder 34-$i$, and a column decoder 36-$i$ for each bank 31. Common sense circuitry is, however, used. Consequently, the circuitry used for reading and verifying the data is shared between all of the banks 31. Thus, the modify sense amplifier block 38, sense amplifier read block 40, high voltage switches 42, data multiplexer 44, and programming logic 46 are used for all arrays 31-3 through 31-$n$. The modify sense amplifier block 38 is connected to the write bit line 47, while the sense amplifier read block 40 is coupled to the read bit line 48. Programming logic 46 controls the high voltage switches 42.

Although the conventional memory device 30 functions, one of ordinary skill in the art will readily recognize that there are issues with such an architecture. In particular, offsets in the sense circuitry 38 and 40 reduce the margin allowed for reading current from a particular cell in the array 32-$i$, as well as a reference current, are reduced. Thus, it may be more difficult to accurately determine the data stored in a cell. The coupling of the modify sense amplifier block 38 to the write bit line 47 and the sense amplifier read block 40 to the read bit line 48 may introduce coupling between the signal being output using the read bit line 47 and the data in arrays 32-$i$ below the read bit line 47.

FIG. 3 depicts the conventional memory device 50, which has m banks 60-1 through 60-$m$. Each bank 60-$i$ includes an array 62-$i$ of conventional storage cells (not explicitly shown). The conventional memory 60 includes an x decoder 64-$i$, and a column decoder 66-$i$ for each bank 60-$i$. In addition, the sensing circuitry is local to each bank 60-$i$. Thus, the sense amplifier block 68-$i$, high voltage switches 70-$i$, data multiplexer 72-$i$, and programming logic 74-$i$ are used for each array 60-1 through 60-$m$. Each bank 60-$i$ thus includes reading and verifying circuitry for each bank 60-$i$.

Use of the conventional memory device 50 avoids some of the issues of the conventional memory device 30. All sensing and addressing circuitry is local to each bank 60-$i$. Consequently, the offsets and coupling described above are avoided. However, the area occupied by the conventional memory 60 has increased significantly, which is undesirable. In addition, because the area consumed by the sensing circuitry 68-1 through 68-$m$, 70-1 through 70-$m$, 72-1 through 72-$m$, and 74-1 through 74-$m$, routing of sensing signals is made significantly more difficult.

Accordingly, what is needed is a mechanism for more efficiently performing read-while-write and read-while-erase operations while allowing the memory to consume less area. The present invention addresses such a need.

BRIEF SUMMARY OF THE INVENTION

The present invention provides a method and system for providing a multi-bank memory is described. The method and system comprise providing a plurality of banks. Each of the plurality of banks includes at least one array including a plurality of memory cells and analog sensing circuitry. The method and system further comprise providing common digital sensing circuitry coupled with the plurality of banks.

According to the method and system disclosed herein, the present invention provides a multi-bank memory that has a wider reading margin while consuming less area.

DETAILED DESCRIPTION OF THE INVENTION

The present invention relates to memory devices. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a method and system for providing a multi-bank memory is described. The method and system comprise providing a plurality of banks. Each of the plurality of banks includes at least one array including a plurality of memory cells and analog sensing circuitry. The method and system further comprise providing common digital sensing circuitry coupled with the plurality of banks.

The present invention will be described in terms of a particular memory having a particular number of banks. However, one of ordinary skill in the art will readily recognize that the method and system are consistent with the use of another memory having a different number of banks.

Figure 1:
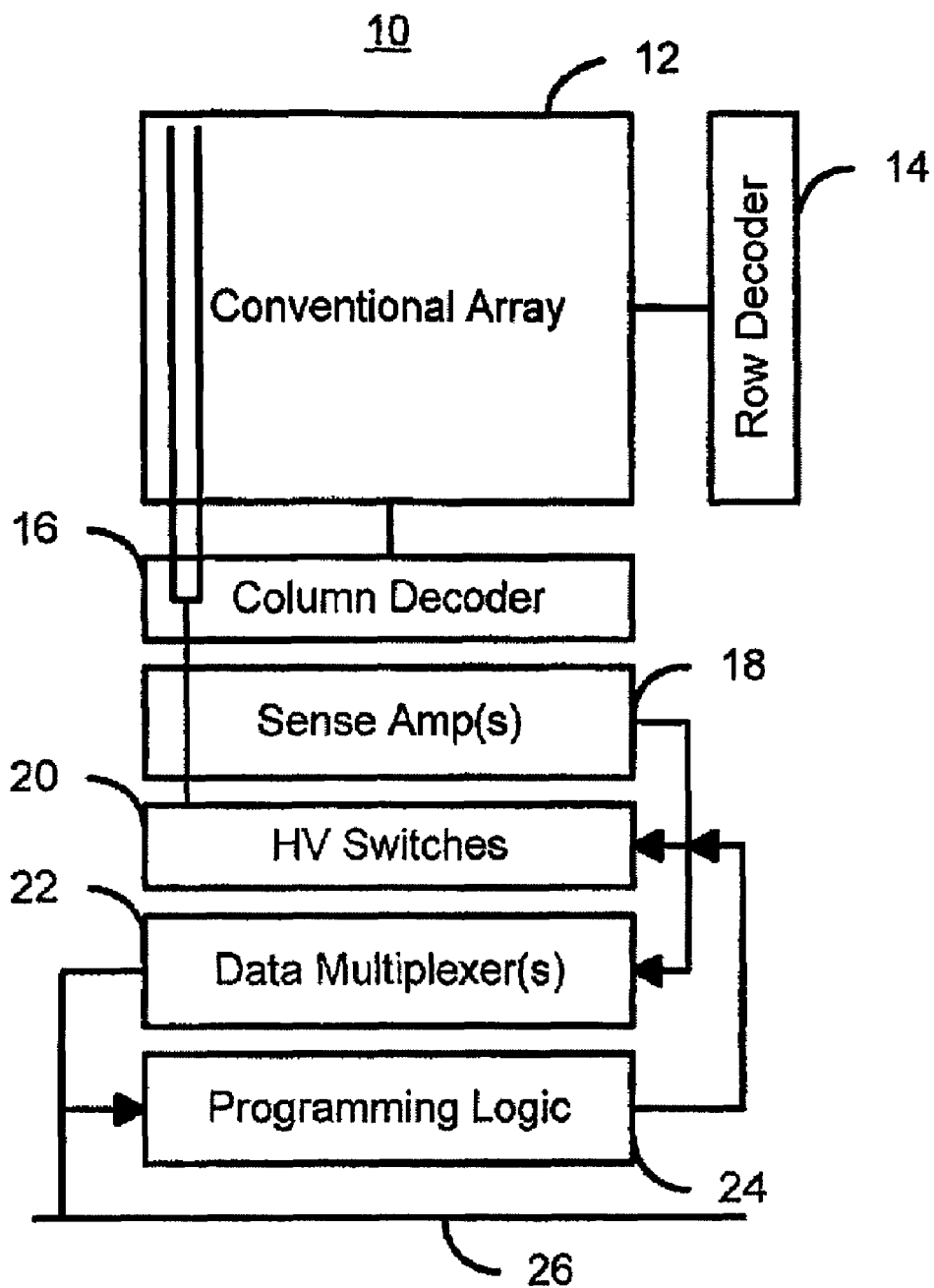
FIG. 1 is a diagram of a single bank memory device.
Figure 2:
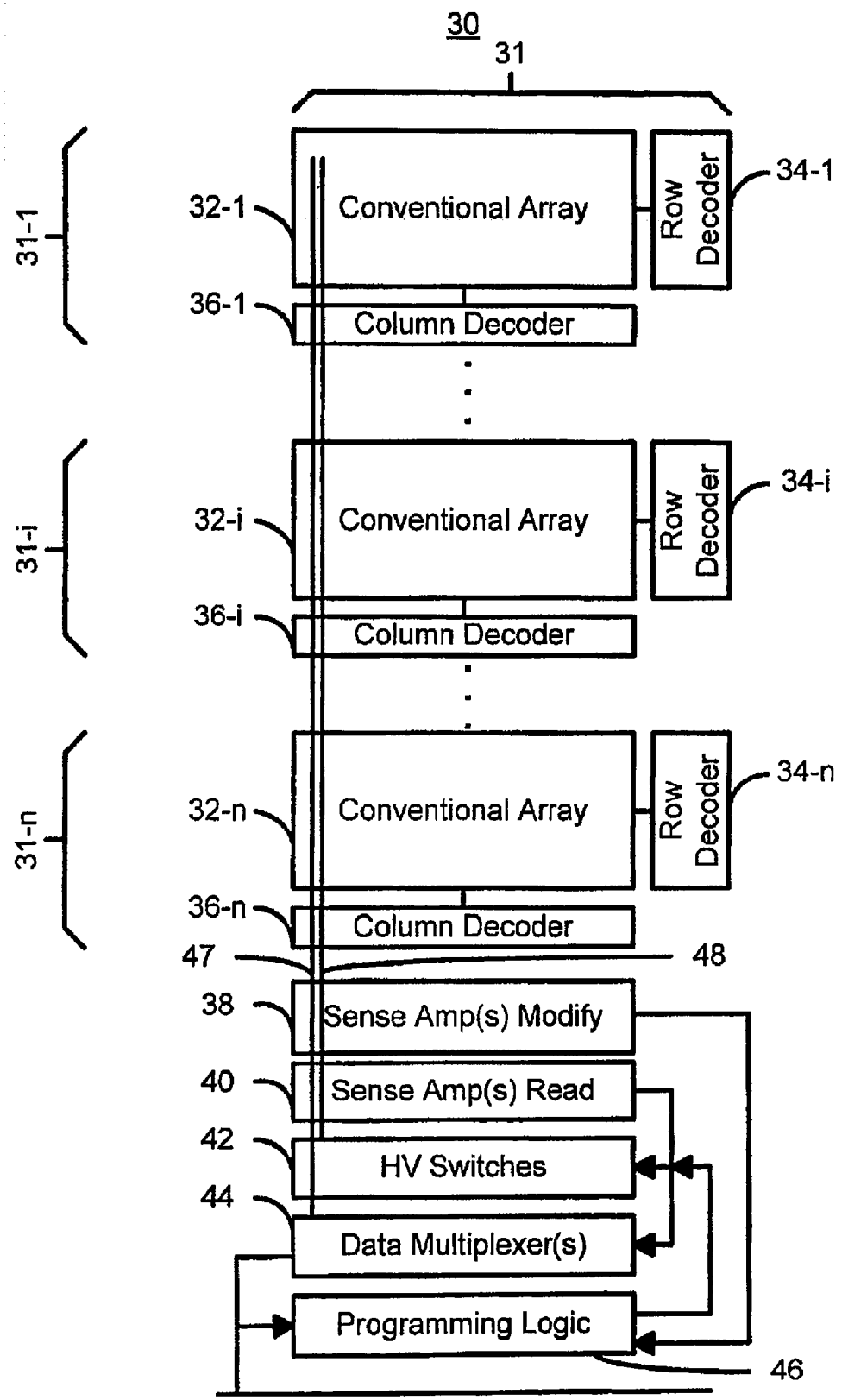
FIG. 2 is a diagram of a first conventional multiple bank memory device.
Figure 3:
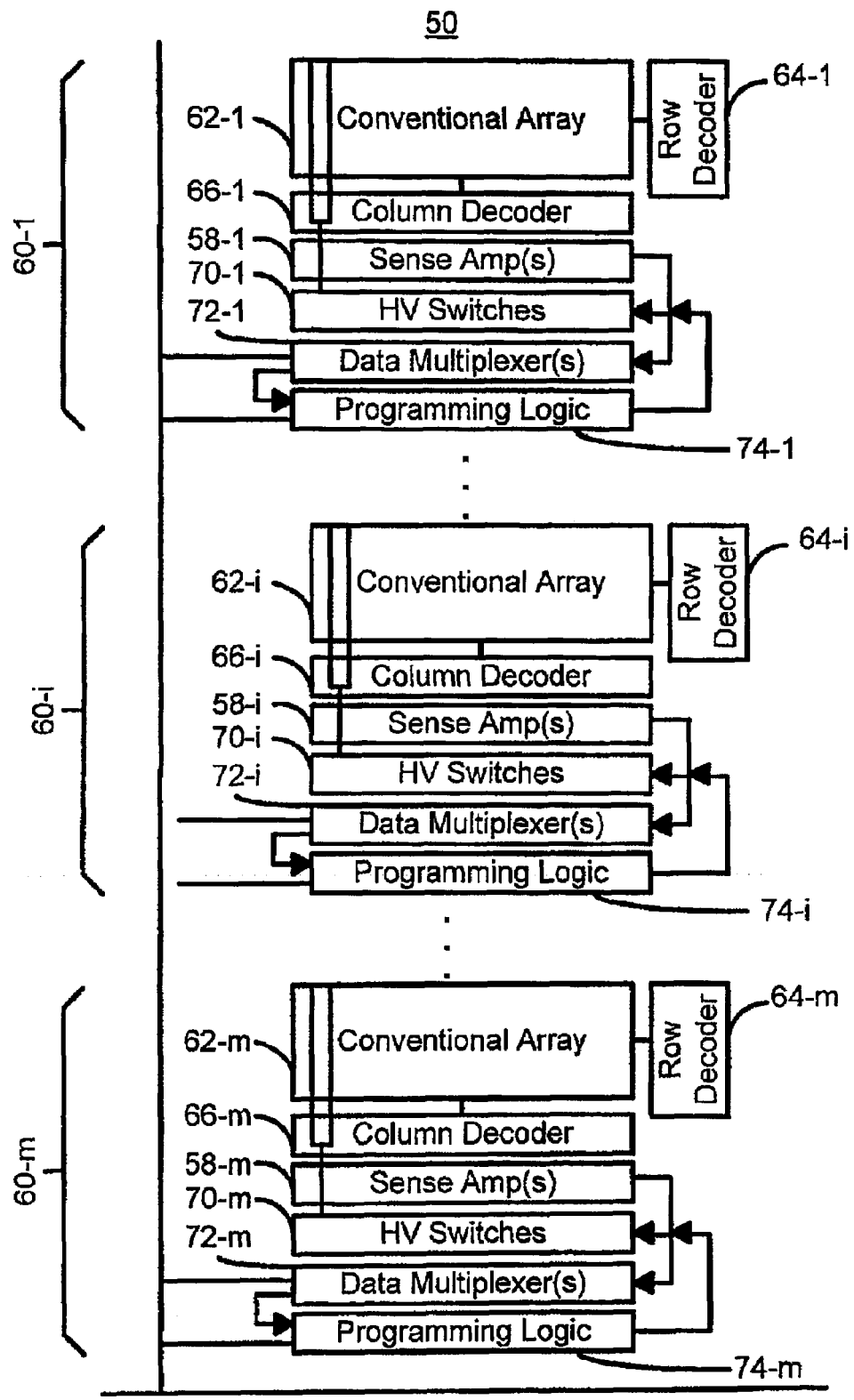
FIG. 3 is a diagram of a second conventional multiple bank memory device.
Figure 4:
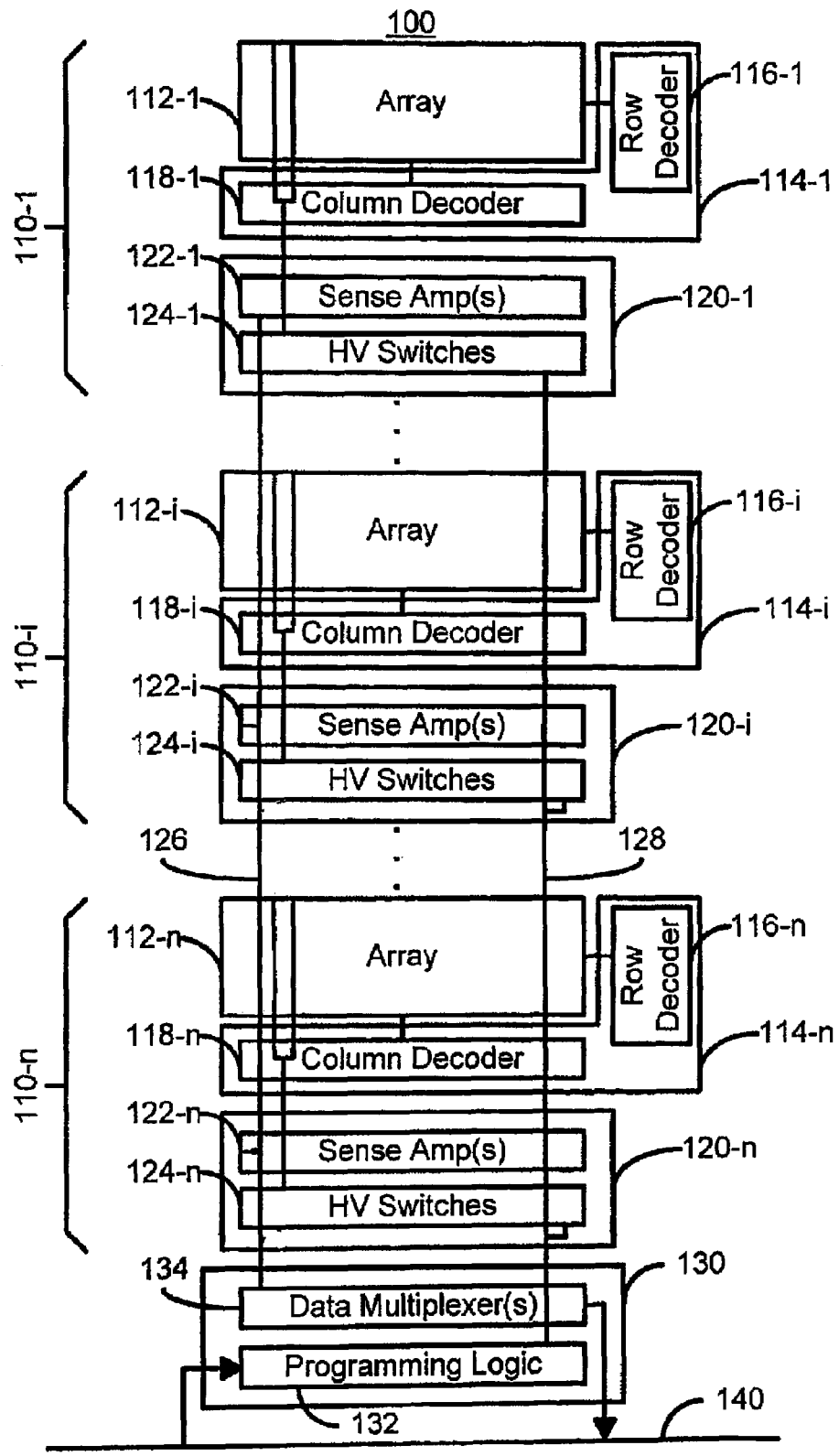
FIG. 4 is a diagram depicting one embodiment of a multiple bank memory device in accordance with the present invention.

To more particularly describe the present invention, refer to FIG. 4 depicting one embodiment of a multiple bank memory device 100 in accordance with the present invention. The memory device 100 is preferably a nonvolatile flash memory. The memory device 100 includes memory banks 110-1 through 110-n. Each of the banks 110-i includes an array 112-i, where i is from 1 through n. The array 112-i has memory cells that are preferably arranged into rows and columns. Each memory bank 110-i also preferably includes addressing circuitry 114-i. The addressing circuitry 114-i includes a row decoder 116-i and a column decoder 118-i. Furthermore, each memory bank 110-i includes analog sensing circuitry 120-i. The analog sensing circuitry 120-i includes sense amplifier(s) 122-i and high voltage switches 124-i. Thus, the sensing circuitry has been divided into an analog portion 120-i that is associated with each of the banks 110-i and a digital portion that is common to the banks 110-1 through 110-n.

The memory device 100 also includes common digital sensing circuitry 130. The common digital sensing circuitry 130 includes programming logic 132 and data multiplexer 134. The programming logic 132 is connected to the high voltage switches 124-i for each memory bank 110-i through the line 128. The data multiplexer 134 is connected to the sense amplifier(s) 122-i for each memory bank 110-i through the line 126. The data multiplexer 134 drives the I/O bus 140. The programming logic 132 receives data that is to be programmed to the banks 110-1 through 110-n from the I/O bus 140. The programming logic 132 also controls the high voltages switches 124-i for each of the memory banks 110-i and receives read and verified data from the sense amplifier(s) 122-i from each of the memory banks 110-i.

In operation, the column decoder 118-i routes the addressed bit line to the sense amplifier(s) 122-i. The verified, digital output of the sense amplifier(s) 122-i is provided to the data multiplexer 134 via line(s) 126. The line(s) 126 carrying one or more signals preferably pass over the arrays 112-i and are shielded by at least one ground line (not shown) to prevent the signals on the line(s) 126 from coupling with the arrays 112-i. For modifying the memory 100, the programming logic 132 controls the high voltage switches 124-i. The control signals are provided via line(s) 128. In a preferred embodiment, the line(s) 128 also run over the arrays 112-i, close to the line(s) 126.

Using the memory device 100, read-while-write and read-while-erase operations can be performed. In addition, because the analog sensing circuitry 120-i is provided for each bank 110-i, any offsets between the reading and verifying operations are reduced. Consequently, a larger margin is allowed for current read from the array 112-i. Moreover, because only the analog sensing circuitry 120-i is provided for each bank 110-i, this larger margin is provided without consuming as much area as, for example, the conventional memory 50.

Figure 5:
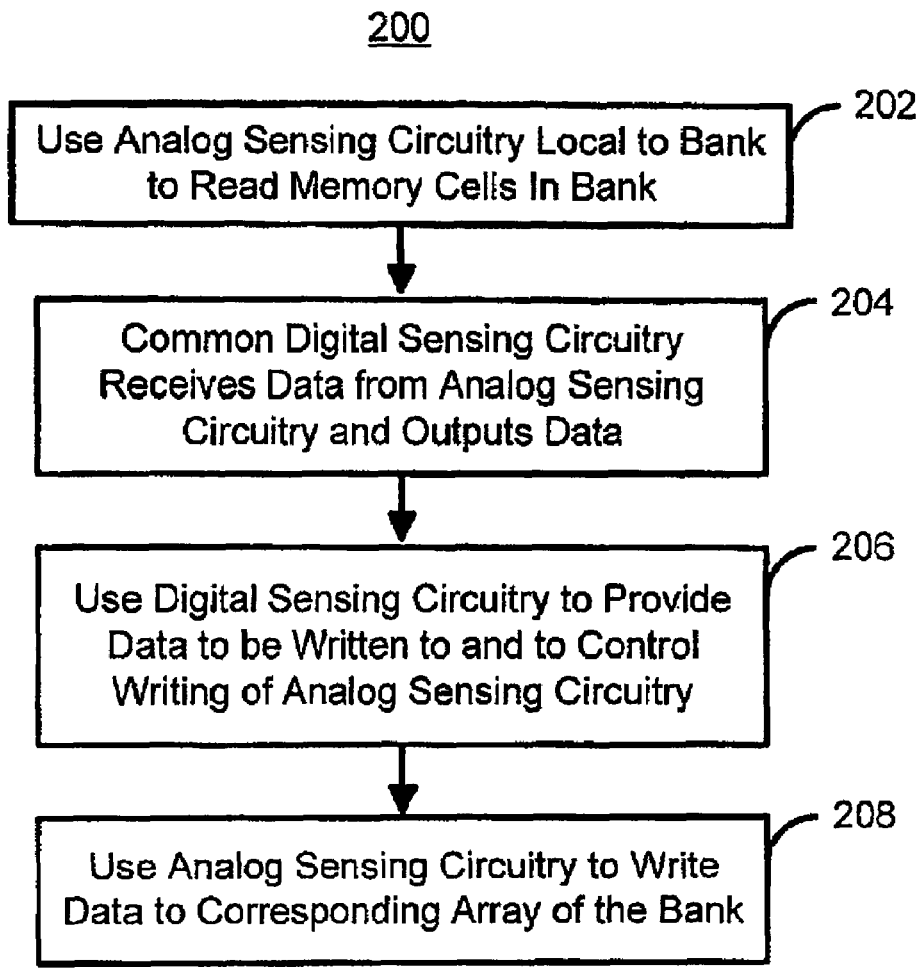
FIG. 5 is a diagram depicting one embodiment of a method in accordance with the present invention for using a multiple bank memory device.

FIG. 5 is a diagram depicting one embodiment of a method 200 in accordance with the present invention for using a multiple bank memory device, such as the memory device 100. The method 200 is described in the context of the system 100. However, nothing prevents the use of the method 200 with another system. Analog sensing circuitry 120-i specific to a bank 110-i of the memory is used to read at least some of the memory cells in the bank 110-i, via step 202. In a preferred embodiment, step 202 includes using the analog sensing circuitry 120-i to output signal(s) based on the reading of the memory cells. The output signal(s) are preferably digital. The method further includes utilizing common digital sensing circuitry 130 to receive the output signal(s) from the analog sensing circuitry 120-i, via step 204. Also in Step 204, the digital sensing circuitry 130 outputs the data read from the bank 110-i. The common digital sensing circuitry 130 also preferably provides data to be programmed to the analog sensing circuitry 120-i and controls the analog sensing circuitry 120-i during writing, via step 206. The analog sensing circuitry 120-i actually writes the data to memory cells the corresponding array 112-i of the bank 110-i.

Thus, using the method 200, the multiple bank memory 100 can be read from and programmed. Thus, the memory 100 that consumes less silicon while reducing offsets between reading and verifying can be used.

A method and system for providing a multi-bank memory has been disclosed. The present invention has been described in accordance with the embodiments shown, and one of ordinary skill in the art will readily recognize that there could be variations to the embodiments, and any variations would be within the spirit and scope of the present invention. Software written according to the present invention is to be stored in some form of computer-readable medium, such as memory, CD-ROM or transmitted over a network, and executed by a processor. Consequently, a computer-readable medium is intended to include a computer readable signal which, for example, may be transmitted over a network. Accordingly, many modifications may be made by one of ordinary skill in the art without departing from the spirit and scope of the appended claims.

We claim:

1. A multi-bank memory comprising:
   a first bank and a second bank, the first and second banks each including at least one array and an analog sensing circuitry, each array including a plurality of memory cells, each analog sensing circuitry including at least one high voltage switch;
   common digital sensing circuitry coupled with the analog sensing circuitry of the first bank and analog sensing circuitry of the second bank via a single output line, the common digital sensing circuitry including a programming logic and at least one multiplexer, the at least one multiplexer driving an I/0 bus and the programming logic receiving data that is to be programmed to the first bank from the I/O bus and receiving verified data from the analog sensing circuitry in the first bank after a read operation, the single output line transmitting information between the analog sensing circuitry of the first bank and the common digital sensing circuitry, the single output line being shielded from a the second bank.

2. The multi-bank memory of claim 1 wherein each of the first bank and the second bank further includes addressing circuitry.

3. The multi-bank memory of claim 2 wherein the addressing circuitry includes a column decoder.

4. The multi-bank memory of claim 3 wherein the addressing circuitry includes a row decoder.

5. The multi-bank memory of claim 1 wherein the analog sensing circuitry further includes:
at least one sense amplifier.

6. The multi-bank memory of claim 5 wherein the single output line is coupled with the at least one sense amplifier and the common digital sensing circuitry.

7. The multi-bank memory of claim 6 further including at least one ground line, the single output line being shielded by the at least one ground line.

8. Multi-bank memory comprising:
a first bank and a second bank, the first and second banks each including at least one array including a plurality of storage cells, addressing circuitry, and analog sensing circuitry, the analog sensing circuitry including at least one sense amplifier and at least one high voltage switch;
common digital sensing circuitry coupled with the analog sensing circuitry of the first bank and analog sensing circuitry of the second bank via a single output line, the common digital sensing circuitry including programming logic and at least one data multiplexer, the at least one multiplexer driving an I/O bus and the programming logic receiving data that is to be programmed to the first bank from the I/O bus and receiving verified data from the analog sensing circuitry in the first bank after a read operation, the single output line transmitting information between the at least one sense amplifier of the first bank and the common digital sensing circuitry, the single output line being shielded from the second bank.

9. A method for providing a multi-bank memory comprising:
providing a first bank and a second bank, the first and second banks each including at least one array, addressing circuitry, and analog sensing circuitry, the at least one array including a plurality of memory cells, each analog sensing circuitry including at least one high voltage switch;
providing common digital sensing circuitry coupled with the analog sensing circuitry of the first bank and analog sensing circuitry of the second bank via a single output line, the common digital sensing circuitry including a programming logic and at least one multiplexer, the at least one multiplexer driving an I/O bus and the programming logic receiving data that is to be programmed to the first bank from the I/O bus and receiving verified data from the analog sensing circuitry in the first bank after a read operation; and
transmitting information through the single output line between the analog sensing circuitry of the first bank and the common digital sensing circuitry, the single output line being shielded from the second bank.

10. A method for reading a portion of a multi-bank memory including a first bank and a second bank, the first and second banks each having an array including a plurality of memory cells, the method comprising:
utilizing an analog sensing circuitry specific to the first bank to read at least a portion of the plurality of memory cells for the first bank and to output at least one signal based on data stored in the portion of the plurality of memory cells, the analog sensing circuitry including at least one sense amplifier and at least one high voltage switch;
utilizing an analog sensing circuitry specific to the second bank to read at least a portion of the plurality of memory cells for the second bank and to output at least one signal based on data stored in the portion of the plurality of memory cells, the analog sensing circuitry including at least one sense amplifier and at least one high voltage switch;
outputting the at least one signal from the analog sensing circuitry specific to the first bank to common digital sensing circuitry via a single output line shielded from the second bank, wherein the single output line is coupled with the analog sensing circuitry of the first bank, the analog circuitry of second bank, and the common digital sensing circuitry; and
utilizing the common digital sensing circuitry for receiving the at least one signal from the analog sensing circuitry of the first bank, the common digital sensing circuitry including programming logic and at least one data multiplexer, the at least one multiplexer driving an I/O bus and the programming logic receiving data that is to be programmed to the first bank from the I/O bus and receiving verified data from the analog sensing circuitry in the first bank after a read operation.

11. The method of claim 10 further comprising:
utilizing the common digital sensing circuitry for providing data to be programmed to the analog sensing circuitry.

12. The multi-bank memory of claim 1 further including at least one ground line, the single output line being shielded by the at least one ground line.

13. The multi-bank memory of claim 8 further including at least one ground line, the single output line being shielded by the at least one ground line.

14. The method of claim 9 further comprising:
providing at least one ground line, the single output line being shielded by the at least one ground line.

15. The method of claim 10 wherein the single output line is shielded by at least one ground line.

* * * * *

UNITED STATES PATENT AND TRADEMARK OFFICE
CERTIFICATE OF CORRECTION

PATENT NO. : 7,430,150 B2 Page 1 of 1
APPLICATION NO. : 11/123544
DATED : September 30, 2008
INVENTOR(S) : Frulio et al.

It is certified that error appears in the above-identified patent and that said Letters Patent is hereby corrected as shown below:

In column 1, line 29, delete "input/ouput" and insert -- input/output --, therefor.

In column 3, line 28, delete "110-includes" and insert -- 110-i includes --, therefor.

In column 4, line 57, in Claim 1, delete "I/0" and insert -- I/O --, therefor.

In column 4, line 64, in Claim 1, after "from" delete "a".

In column 5, line 14, in Claim 8, before "Multi-bank" insert -- A --.

Signed and Sealed this

Thirtieth Day of December, 2008

JON W. DUDAS
*Director of the United States Patent and Trademark Office*